US012323684B2

(12) United States Patent
Iwafuchi

(10) Patent No.: US 12,323,684 B2
(45) Date of Patent: *Jun. 3, 2025

(54) CAMERA MODULE, METHOD OF MANUFACTURING CAMERA MODULE, IMAGING APPARATUS, AND ELECTRONIC APPARATUS

(71) Applicant: SONY GROUP CORPORATION, Tokyo (JP)

(72) Inventor: Toshiaki Iwafuchi, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/162,496

(22) Filed: Jan. 31, 2023

(65) Prior Publication Data

US 2023/0179846 A1 Jun. 8, 2023

Related U.S. Application Data

(63) Continuation of application No. 16/923,914, filed on Jul. 8, 2020, now Pat. No. 11,595,551, which is a
(Continued)

(30) Foreign Application Priority Data

Mar. 31, 2016 (JP) .................. 2016-072170

(51) Int. Cl.
*H04N 23/51* (2023.01)
*G03B 11/00* (2021.01)
(Continued)

(52) U.S. Cl.
CPC ............ *H04N 23/51* (2023.01); *G03B 11/00* (2013.01); *G03B 17/02* (2013.01); *H04N 23/54* (2023.01);
(Continued)

(58) Field of Classification Search
CPC ........ H04N 23/51; H04N 23/54; H04N 23/55; H04N 23/57; H04N 25/61; H04N 25/70;
(Continued)

(56) References Cited

U.S. PATENT DOCUMENTS 4,418,284 A 11/1983 Ogawa et al.
6,762,796 B1 * 7/2004 Nakajoh ............. H01L 27/1462
348/340
(Continued)

FOREIGN PATENT DOCUMENTS

JP 2001-257334 9/2001
JP 2003-163342 6/2003
(Continued)

OTHER PUBLICATIONS

International Search Report for International (PCT) Patent Application No. PCT/JP2017/010870, dated May 9, 2017, 2 pages.
(Continued)

*Primary Examiner* — Abdelaaziz Tissire
(74) *Attorney, Agent, or Firm* — SHERIDAN ROSS P.C.

(57) ABSTRACT

The present disclosure relates to a camera module capable of achieving a smaller height, a method of manufacturing a camera module, an imaging apparatus, and an electronic apparatus. An imaging device having its imaging surface bonded to a provisional substrate is attached, and the imaging device in that state is joined to a substrate via an electrode having a TSV structure. After the provisional substrate is detached, an IR cut filter (IRCF) on which a light blocking film is printed or jet-dispensed in a region other than the effective pixel region is bonded to the imaging surface via a transparent resin. Because of this, there is no need to provide any sealing glass in the stage before the imaging surface, and the optical length of the lens can be
(Continued)

shortened. Thus, a smaller height can be achieved. The present disclosure can be applied to camera modules.

20 Claims, 15 Drawing Sheets

Related U.S. Application Data continuation of application No. 16/086,495, filed as application No. PCT/JP2017/010870 on Mar. 17, 2017, now Pat. No. 10,750,060.

(51) Int. Cl.
| | |
|---|---|
| *G03B 17/02* | (2021.01) |
| *H04N 23/54* | (2023.01) |
| *H04N 23/55* | (2023.01) |
| *H04N 23/57* | (2023.01) |
| *H04N 25/61* | (2023.01) |
| *H04N 25/70* | (2023.01) |
| *H04N 25/76* | (2023.01) |
| *H10F 39/00* | (2025.01) |
| *H10F 39/18* | (2025.01) |

(52) U.S. Cl.
CPC ............. *H04N 23/55* (2023.01); *H04N 23/57* (2023.01); *H04N 25/61* (2023.01); *H04N 25/70* (2023.01); *H04N 25/76* (2023.01); *H10F 39/804* (2025.01); *H10F 39/8053* (2025.01); *H10F 39/806* (2025.01); *H10F 39/184* (2025.01)

(58) Field of Classification Search
CPC ........ H04N 25/76; H04N 25/79; G03B 11/00; G03B 17/02; H01L 27/14618; H01L 27/14621; H01L 27/14625; H01L 27/14649; H01L 27/14627; H01L 27/146; H01L 27/1462; H01L 31/02164; H01L 27/14643; H01L 27/14647; H01L 2224/29011; H01L 2924/12043; H01L 25/0756; H01L 2224/97; H01L 2224/16145; G02B 5/208; G02B 5/22; G02B 5/003; G02B 5/282; G02B 5/20
See application file for complete search history.

(56) References Cited

U.S. PATENT DOCUMENTS

| | | | | |
|---|---|---|---|---|
| 7,911,017 | B1* | 3/2011 | de Guzman | H01L 27/14618 257/E31.127 |
| 10,750,060 | B2* | 8/2020 | Iwafuchi | G03B 17/02 |
| 11,595,551 | B2* | 2/2023 | Iwafuchi | H04N 23/57 |
| 2001/0020738 | A1 | 9/2001 | Iizima et al. | |
| 2003/0098912 | A1 | 5/2003 | Hosokai et al. | |
| 2005/0161805 | A1 | 7/2005 | Ono et al. | |
| 2005/0275741 | A1 | 12/2005 | Watanabe et al. | |
| 2006/0023108 | A1* | 2/2006 | Watanabe | H01L 27/14627 348/335 |
| 2006/0024505 | A1 | 2/2006 | Keh et al. | |
| 2007/0019952 | A1 | 1/2007 | Fujimori | |
| 2007/0194439 | A1 | 8/2007 | Kawabata | |
| 2009/0237796 | A1* | 9/2009 | Itoi | G02B 1/105 359/581 |
| 2009/0246651 | A1* | 10/2009 | Fujimori | G03F 7/031 430/7 |
| 2011/0058077 | A1* | 3/2011 | Ono | H01L 27/14625 257/E31.11 |
| 2012/0211852 | A1* | 8/2012 | Iwafuchi | H01L 27/14649 257/435 |
| 2012/0230669 | A1* | 9/2012 | Abe | H01L 27/14685 264/1.7 |
| 2013/0026591 | A1 | 1/2013 | Iwafuchi | |
| 2014/0077063 | A1 | 3/2014 | Cho | |
| 2015/0137297 | A1 | 5/2015 | Boettiger et al. | |
| 2015/0138424 | A1* | 5/2015 | Dobashi | H04N 25/00 348/340 |
| 2015/0287756 | A1* | 10/2015 | Ezoe | C09D 201/00 257/432 |
| 2016/0091643 | A1* | 3/2016 | Arayama | G03F 7/0007 427/160 |
| 2016/0355709 | A1 | 12/2016 | Katou | |
| 2017/0048472 | A1 | 2/2017 | Yang et al. | |
| 2018/0149783 | A1* | 5/2018 | Won | G02B 5/22 |
| 2018/0348415 | A1 | 12/2018 | Sasaki et al. | |
| 2020/0336626 | A1 | 10/2020 | Iwafuchi | |

FOREIGN PATENT DOCUMENTS

| | | |
|---|---|---|
| JP | 2004-096390 | 8/2004 |
| JP | 2005-209967 | 8/2005 |
| JP | 2005-266069 | 9/2005 |
| JP | 2006-005029 | 1/2006 |
| JP | 2007-036481 | 2/2007 |
| JP | 2012-186434 | 9/2009 |
| JP | 2013-041941 | 2/2013 |
| JP | 2013-118206 | 6/2013 |
| JP | 2014-239179 | 12/2014 |
| WO | WO 2015/115537 | 8/2015 |

OTHER PUBLICATIONS

Official Action for U.S. Appl. No. 16/086,495, dated Dec. 12, 2019, 16 pages.
Notice of Allowance for U.S. Appl. No. 16/086,495, dated Apr. 7, 2020, 13 pages.
Corrected Notice of Allowance for U.S. Appl. No. 16/086,495, dated Jul. 16, 2020, 2 pages.
Official Action for U.S. Appl. No. 16/923,914, dated Oct. 27, 2021, 12 pages.
Official Action for U.S. Appl. No. 16/923,914, dated Apr. 7, 2022, 23 pages.
Official Action for U.S. Appl. No. 16/923,914, dated Jul. 13, 2022, 24 pages.
Notice of Allowance for U.S. Appl. No. 16/923,914, dated Nov. 1, 2022, 9 pages.
Corrected Notice of Allowance for U.S. Appl. No. 16/923,914, dated Feb. 2, 2023, 2 pages.

* cited by examiner

CAMERA MODULE, METHOD OF MANUFACTURING CAMERA MODULE, IMAGING APPARATUS, AND ELECTRONIC APPARATUS

CROSS-REFERENCE TO RELATED APPLICATIONS

This application is a Continuation of a U.S. patent application Ser. No. 16/923,914, filed Jul. 8, 2020, which is a Continuation of a U.S. patent application Ser. No. 16/086,495 filed Sep. 19, 2018, now U.S. Pat. No. 10,750,060, which is a national stage application under 35 U.S.C. 371 and claims the benefit of PCT Application No. PCT/JP2017/010870 having an international filing date of 17 Mar. 2017, which designated the United States, which PCT application claimed the benefit of Japanese Patent Application No. 2016-072170 filed 31 Mar. 2016, the entire disclosures of each of which are incorporated herein by reference.

TECHNICAL FIELD

The present disclosure relates to a camera module, a method of manufacturing a camera module, an imaging apparatus, and an electronic apparatus, and more particularly, to a camera module capable of achieving a smaller height, a method of manufacturing a camera module, an imaging apparatus, and an electronic apparatus.

BACKGROUND ART

A camera module including a solid-state imaging device that is typically a complementary metal oxide semiconductor (CMOS) is mounted in a highly portable electronic apparatus and the like such as a smartphone these days, and needs for such camera modules are increasing.

There is a suggested configuration for a camera module. In the configuration, warpage is prevented with a multilayer film formed on the upper and lower surfaces of a sealing glass provided on the imaging surface, and the camera module is bonded to the substrate with solder balls, for example (see Patent Document 1).

Further, there is a suggested technique by which a black adhesion layer is provided to surround the imaging surface of a solid-state imaging device. In this manner, appearances of flare and ghosts due to unnecessary light incidence are reduced, and bonding to the substrate is achieved with solder balls (see Patent Document 2).

CITATION LIST

Patent Documents

Patent Document 1: Japanese Patent Application Laid-Open No. 2013-041941
Patent Document 2: Japanese Patent Application Laid-Open No. 2013-118206

SUMMARY OF THE INVENTION

Problems To Be Solved By The Invention

However, in a case where a sealing glass exists on the imaging surface as in the technology disclosed in Patent Document 1described above, the optical length of the lens increases by the thickness of the sealing glass. Therefore, the reduction in height might be limited when a camera module is formed.

Further, in the technology disclosed in Patent Document 2, reflection of incident light occurs on the end faces of the black light blocking film, and the reflected light enters the imaging device. Therefore, there is a possibility that ghosts or flare will appear.

Furthermore, in either of Patent Documents 1 and 2, solder balls are used to achieve bonding to the substrate. Therefore, the reduction in height might be limited when a camera module is formed. Further, the substrate might be deflected by the solder balls, and distortions might appear in images.

The present disclosure is made in view of such circumstances, and in particular, aims to provide a camera module that is designed to achieve a reduction in height while reducing appearances of ghosts and flare.

Solutions To Problems

A camera module of one aspect of the present disclosure is a camera module that includes: an imaging device that captures an image; an infrared light removal unit that removes infrared light toward the imaging device in a stage before the imaging device; and a light collection unit that collects light incident on the imaging device. In the stage before the imaging device in an imaging direction, only the light collection unit and the infrared light removal unit are provided.

The infrared light removal unit can be an IR cut filter (IRCF), and a light blocking film can be formed in a region of the IRCF, the region corresponding to a region other than an effective pixel region of the imaging device.

The light blocking film can be printed or jet-dispensed on the IRCF.

A space surrounded by the light blocking film, the IRCF, and an imaging surface of the imaging device can be filled with a transparent resin.

The imaging device and a substrate can be connected by a mutually provided electrode having a TSV structure.

Between the imaging device and the substrate, a space other than the connected electrode having the TSV structure can be filled with an underfill resin.

An imaging apparatus of one aspect of the present disclosure is an imaging apparatus that includes: an imaging device that captures an image; an infrared light removal unit that removes infrared light toward the imaging device in a stage before the imaging device; and a light collection unit that collects light incident on the imaging device. In the stage before the imaging device, only the light collection unit and the infrared light removal unit are provided.

An electronic apparatus of one aspect of the present disclosure is an electronic apparatus that includes: an imaging device that captures an image; an infrared light removal unit that removes infrared light toward the imaging device in a stage before the imaging device; and a light collection unit that collects light incident on the imaging device. In the stage before the imaging device, only the light collection unit and the infrared light removal unit are provided.

A method of manufacturing a camera module of one aspect of the present disclosure is a method of manufacturing a camera module that includes: an imaging device that captures an image; an infrared light removal unit that removes infrared light toward the imaging device in a stage before the imaging device; and a light collection unit that collects light incident on the imaging device, only the light collection unit and the infrared light removal unit being provided in the stage before the imaging device. The method includes: bonding a provisional substrate to an imaging surface of the imaging device; joining a surface of the imaging device bonded to the provisional substrate to a substrate, the provisional substrate not being bonded to the surface of the imaging device; and detaching the provisional substrate from the imaging surface of the imaging device.

After the provisional substrate is detached from the imaging surface of the imaging device, the infrared light removal unit that removes infrared light toward the imaging device can be bonded to the imaging surface of the imaging device, and the light collection unit can be mounted in the stage before the infrared light removal unit.

The infrared light removal unit can be an IR cut filter (IRCF), and a light blocking film can be formed in a region of the IRCF, the region corresponding to a region other than an effective pixel region of the imaging device.

The light blocking film can be printed or jet-dispensed on the IRCF.

After the provisional substrate is detached from the imaging surface of the imaging device, a transparent resin can be applied between the imaging device and the IRCF when the IRCF is bonded to the imaging surface of the imaging device. A space surrounded by the light blocking film, the printed or jet-dispensed IRCF, and the imaging surface of the imaging device can be filled with the transparent resin.

In one aspect of the present disclosure, only the light collection unit and the infrared light removal unit are provided in the stage before the imaging device.

Effects Of The Invention

According to one aspect of the present disclosure, it is possible to achieve a smaller height while reducing ghosts and flare.

MODES FOR CARRYING OUT THE INVENTION

Figure 1:
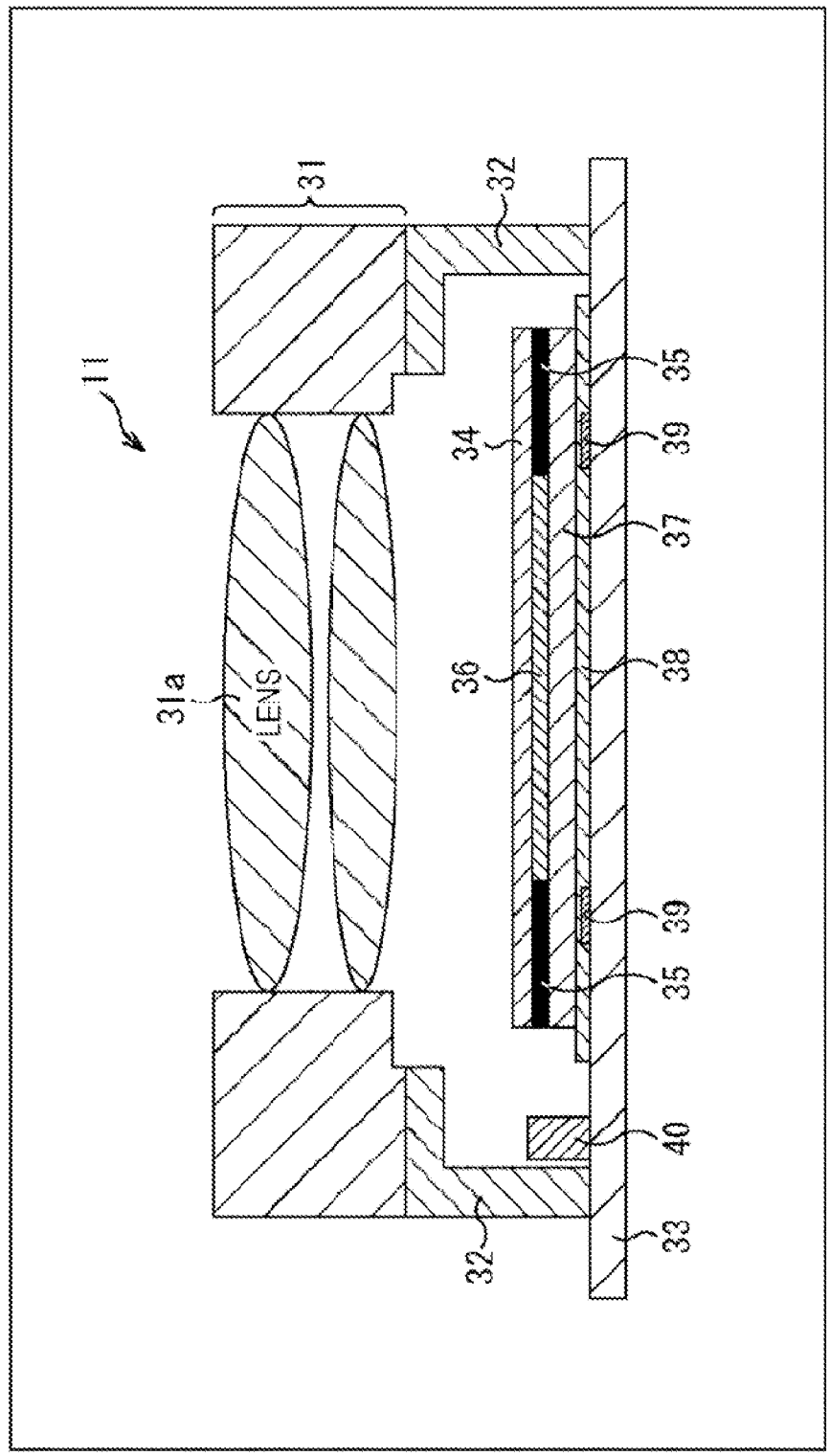
FIG. 1 is a diagram for explaining a side cross-section of a camera module according to the present disclosure.

The following is a detailed description of preferred embodiments of the present disclosure, with reference to the accompanying drawings. Note that, in this specification and the drawings, components having substantially the same functional configurations are denoted by the same reference numerals, and explanation of them will not be repeated.

Example Configuration of a Camera Module of the Present Disclosure

Referring to FIG. 1, the configuration of a camera module to which the technology according to the present disclosure is applied is described.

FIG. 1 is a sectional side view of a camera module 11 of the present disclosure in a case where light enters in a downward direction from above in the drawing.

The camera module 11 has a case 32 formed on a substrate 33 so as to surround an imaging device 37 formed with a complementary metal oxide semiconductor (CMOS) or the like, and other components. A lens block 31 having a lens 31a mounted thereon so that the optical axis of the lens 31a has a predetermined positional relationship with the center position of the imaging device 37 is connected to an opening of the case 32.

Meanwhile, inside the case 32, the imaging device 37 is connected onto the substrate 33 via electrodes 39, and the space other than the electrodes 39 between the substrate 33 and the imaging device 37 is filled with an underfill resin (UF) 38.

An IR cut filter (IRCF) 34 is provided on the imaging surface of the imaging device 37. To prevent light from entering the peripheral region other than the effective pixel region on the imaging surface of the imaging device 37, a light blocking film 35 formed with a black carbon-based resin is printed or jet-dispensed in the region corresponding to the region other than the effective pixel region of the IRCF 34. Further, the space between the imaging surface of the imaging device 37 and the IRCF 34, or the space formed by the IRCF 34, the opening of the printed or jet-dispensed light blocking film 35 and the imaging surface of the imaging device 37, is filled with a transparent resin 36. However, the transparent resin 36 does not need to fill the entire space, and may be provided at least around the imaging surface of the imaging device 37. That is, a space may be left on the imaging surface of the imaging device 37.

As shown in FIG. 1, the light blocking film 35 is printed or jet-dispensed on the peripheral region of the imaging device 37, and the recess formed by the light blocking film 35 is filled with the transparent resin 36. The IRCF 34 is provided in such a situation, and any sealing glass or the like is not provided. With this arrangement, the thickness of a sealing glass does not affect the optical length, and it is possible to reduce the height of the camera module 11.

Further, since the light blocking film 35 is printed or jet-dispensed onto the IRCF 34, the light blocking film 35 is made thinner so that the end faces of the light blocking film 35 can be made extremely small. Thus, light reflection from the end faces of the light blocking film 35 can be prevented. As a result, any reflected light from the end faces of the light blocking film 35 does not enter the imaging device 37. Thus, appearances of ghosts and flare can be reduced.

Furthermore, in the camera module 11 shown in FIG. 1, the imaging device 37 and the substrate 33 are connected by the electrodes 39 that are smaller than solder balls. Accordingly, it is possible to achieve a reduction in height, and deflection of the imaging device 37 due to solder balls can be prevented. Thus, image distortions can be prevented.

Method of Manufacturing the IRCF

Figure 2:
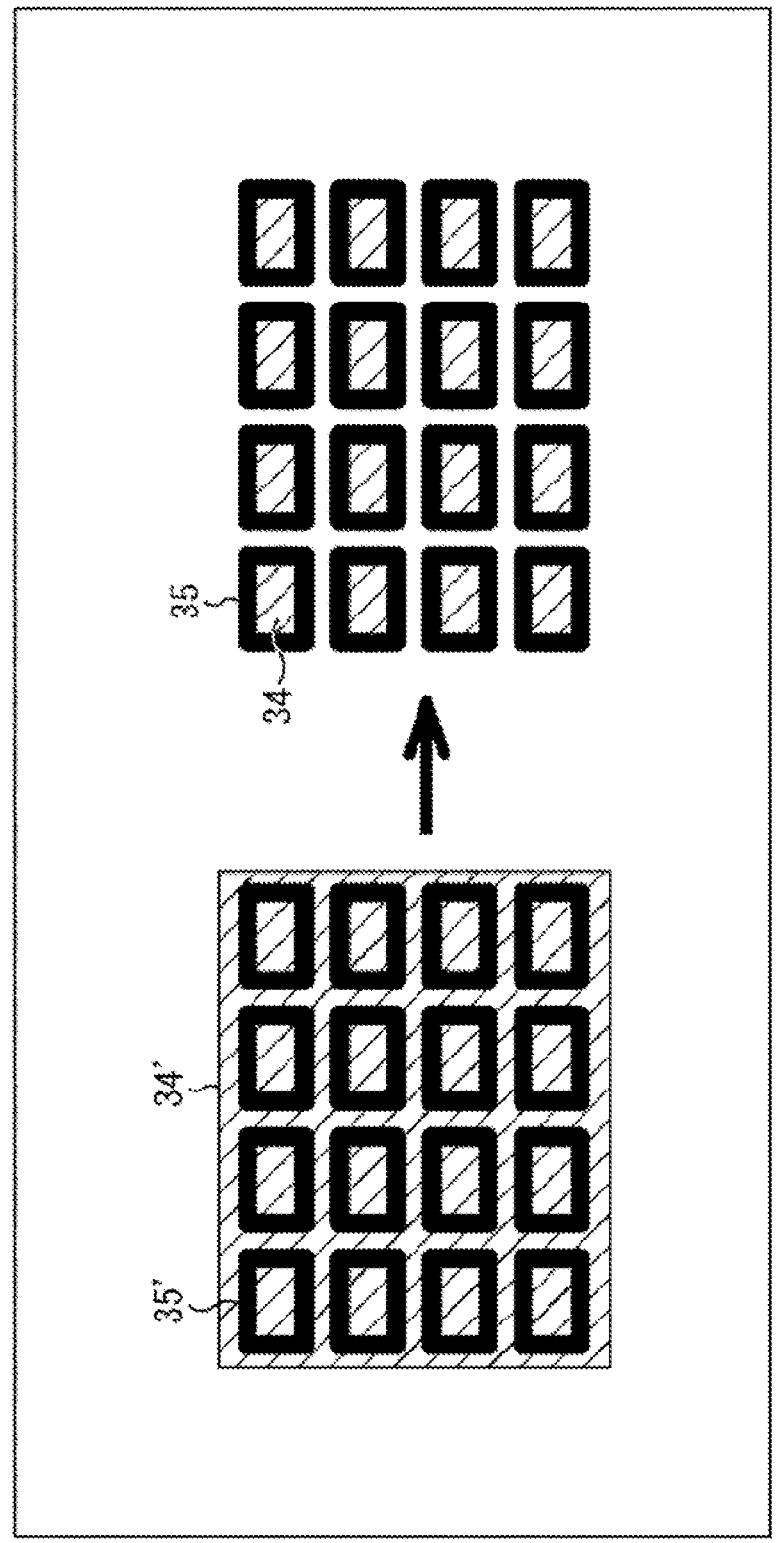
FIG. 2 is a diagram for explaining a method of manufacturing the IRCF shown in FIG. 1.

Next, referring to FIG. 2, a method of manufacturing the IRCF 34 is described.

As shown in the left half of FIG. 2, a pattern of light blocking films 35' of the size corresponding to the imaging device 37 is printed or jet-dispensed with a black carbon-based resin onto a glass 34' that absorbs infrared light.

Then, as shown in the right half of FIG. 2, the glass 34' is then divided into individual pieces of the size of the light blocking films 35'. Thus, the IRCF 34 on which light blocking films 35 are printed is manufactured.

Note that the IRCF 34 preferably has a small area and few defects. The IRCF 34 is a glass that absorbs infrared light and preferably has an antireflection film formed on its surface. Alternatively, the IRCF 34 may be soda-lime glass.

Further, it is expensive to form an IRCF of the same size (300 mm square, for example) as the size of the wafer of the imaging device 37, and form a light blocking film of the same size the wafer, and misalignment of the light blocking film also occurs in the wafer plane. Therefore, the IRCF 34 having the light blocking films 35 attached thereto is divided into individual pieces, and is then bonded to the imaging device 37. In this manner, costs can be lowered, and high-precision production can be achieved.

Method of Manufacturing the Camera Module

Next, referring to FIGS. 3 through 8, a method of manufacturing the camera module 11 is described.

Figure 3:
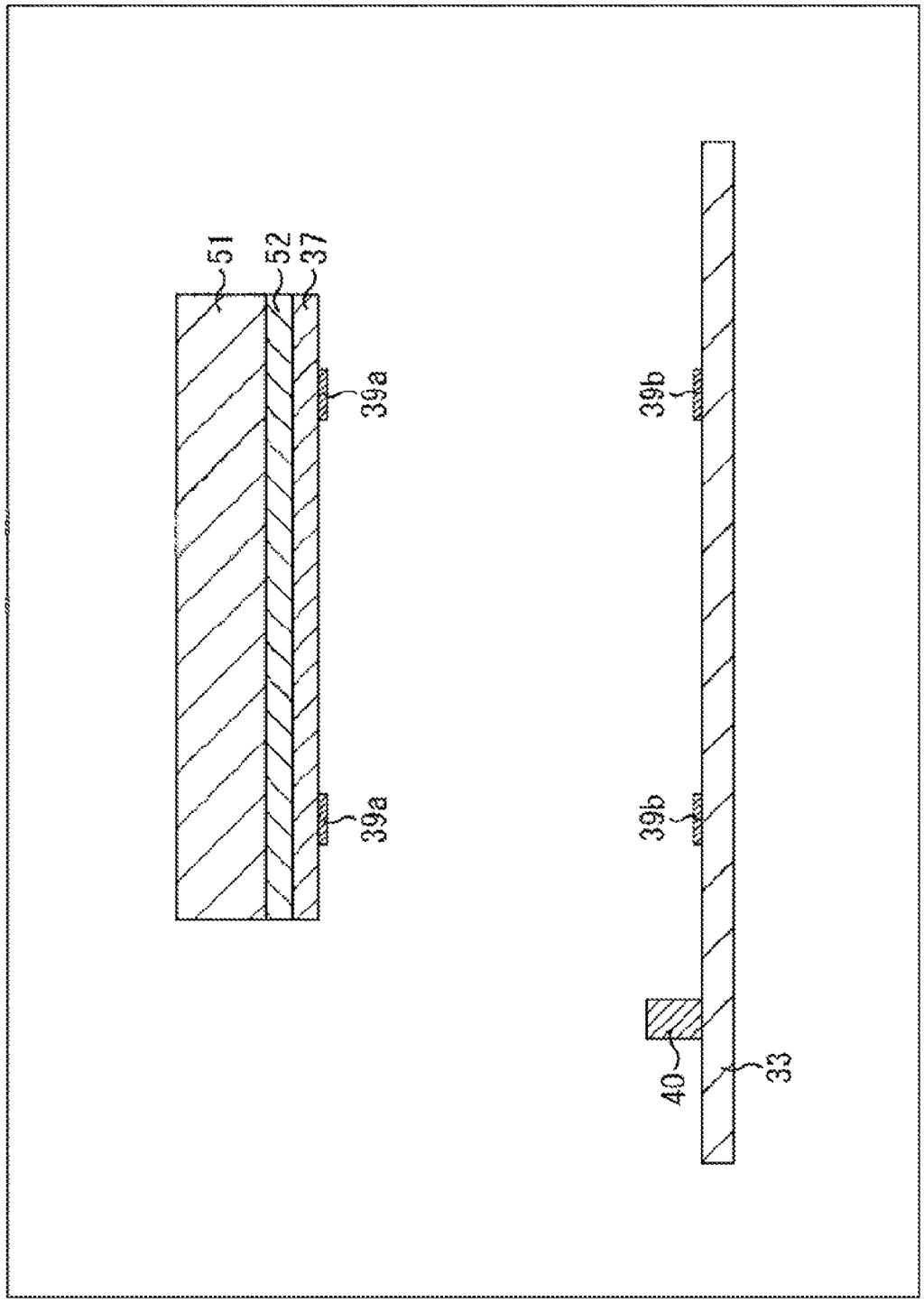
FIG. 3 is a diagram for explaining a method of manufacturing the camera module shown in FIG. 1.

In a first step, as shown in an upper portion of FIG. 3, a provisional substrate 51 formed with Si or the like is bonded with a provisional bonding member 52, facing the imaging surface of an individualized imaging device 37, for example. At this stage, electrodes 39a are provided on the back side of the imaging surface of the imaging device 37.

Note that the provisional substrate 51 is only required to temporarily fix the imaging device 37 with the provisional bonding member 52. Therefore, the provisional substrate 51 may be formed with a material other than Si, as long as the material has such a degree of hardness not to deflect or distort the imaging device 37.

Further, electrodes 39b are also provided on the substrate 33 at positions facing the electrodes 39a provided on the back side of the imaging surface of the imaging device 37. A passive component 40 such as an autofocus driver is further provided on the substrate 33.

The electrodes 39a are wiring lines that are formed with a redistribution layer (RDL) surface of Cu and have a through-silicon-via (TSV) structure. The Cu surface is subjected to solder precoating with an alloy of Ni and Au. Alternatively, electroless plating of Ni or Au, or electroplating is performed on the Cu surface. Meanwhile, the electrodes 39b are wiring lines that are formed with an RDL surface of Cu and have a TSV structure. The Cu surface is subjected to solder precoating. Alternatively, electroless plating of Ni or Au, or electroplating is performed on the Cu surface.

The electrodes 39a and 39b then join the surfaces subjected to the solder precoating, to each other. Specifically, in a case where both the electrodes 39a and 39b are formed with Au, the surfaces are bonded to each other by ultrasonic bonding.

Further, after the passive component 40 and the electrodes 39a and 39b are mounted, flux cleaning is performed.

Figure 4:
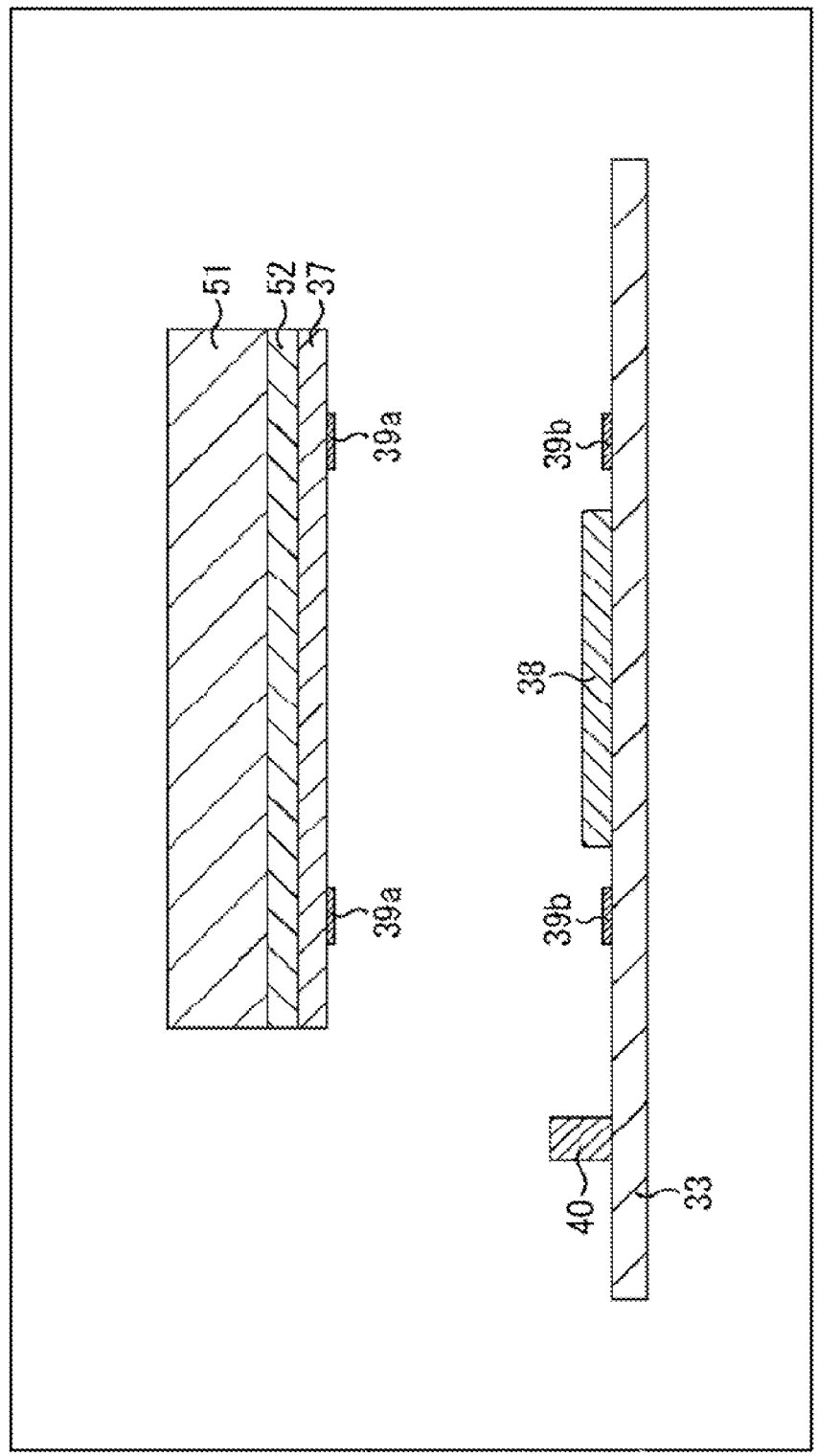
FIG. 4 is a diagram for explaining the method of manufacturing the camera module shown in FIG. 1.

In a second step, as shown in FIG. 4, a flux-containing underfill resin (UF) 38 is applied onto the substrate 33 facing the imaging device. At this stage, however, at least one of the electrodes 39a or 39b is precoated with solder. In other words, the UF 38 is pressed and heated, to connect the electrodes 39a and 39b while removing the oxide film from the solder surface.

Figure 5:
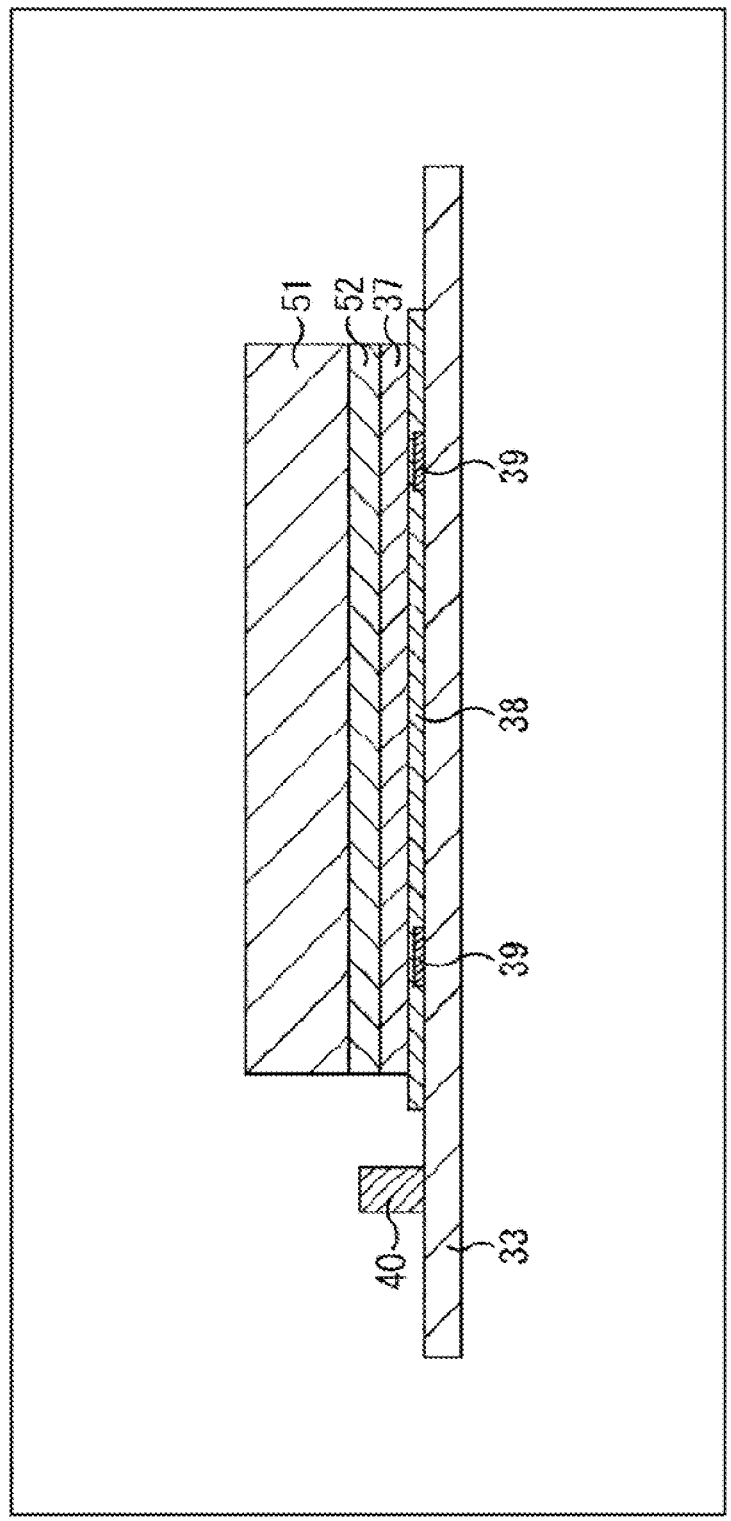
FIG. 5 is a diagram for explaining the method of manufacturing the camera module shown in FIG. 1.

In a third step, as shown in FIG. 5, the imaging device 37 bonded to the provisional substrate 51, and the substrate 33 are pressed against each other and are heated, so that the electrodes 39a and 39b are connected. At this stage, as the imaging device 37 and the substrate 33 are pressed against each other, the UF 38 spreads thinly and fills the peripheral portions of the electrodes 39.

Figure 6:
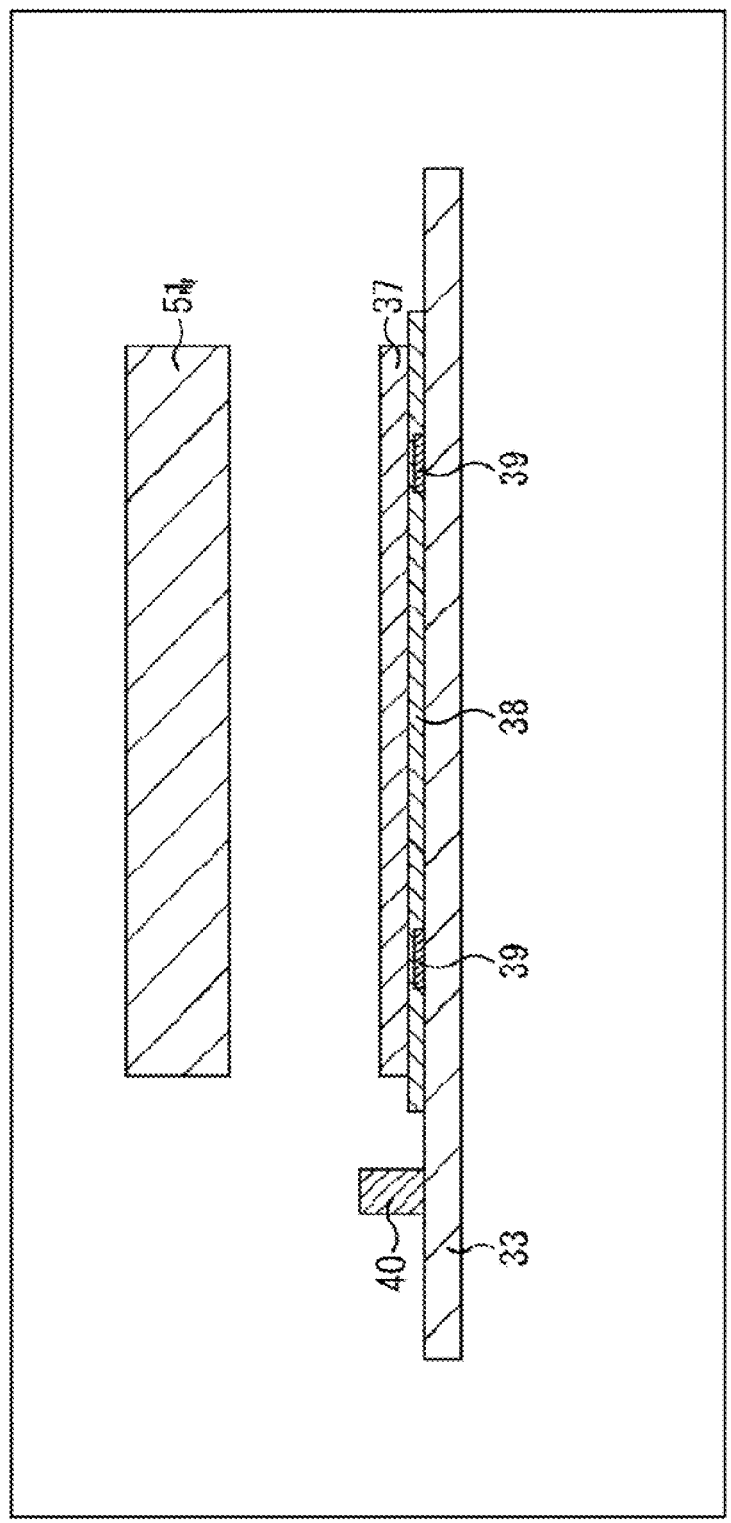
FIG. 6 is a diagram for explaining the method of manufacturing the camera module shown in FIG. 1.

In a fourth step, as shown in FIG. 6, the provisional connecting member 52 that connects the provisional substrate 51 and the imaging device 37 is removed with a solvent or the like, and the provisional substrate 51 is detached from the imaging device 37. Through this process, the imaging surface of the imaging device 37 is exposed, and is subjected to flux cleaning in the exposed state.

In this process, when the provisional substrate 51 is detached from the imaging device 37, warpage or deflection easily occurs in the imaging device 37. Therefore, processing is preferably performed while the substrate 33 is attached to a glass plate having a predetermined thickness, for example, so that the substrate 33 can keep its flatness.

Figure 7:
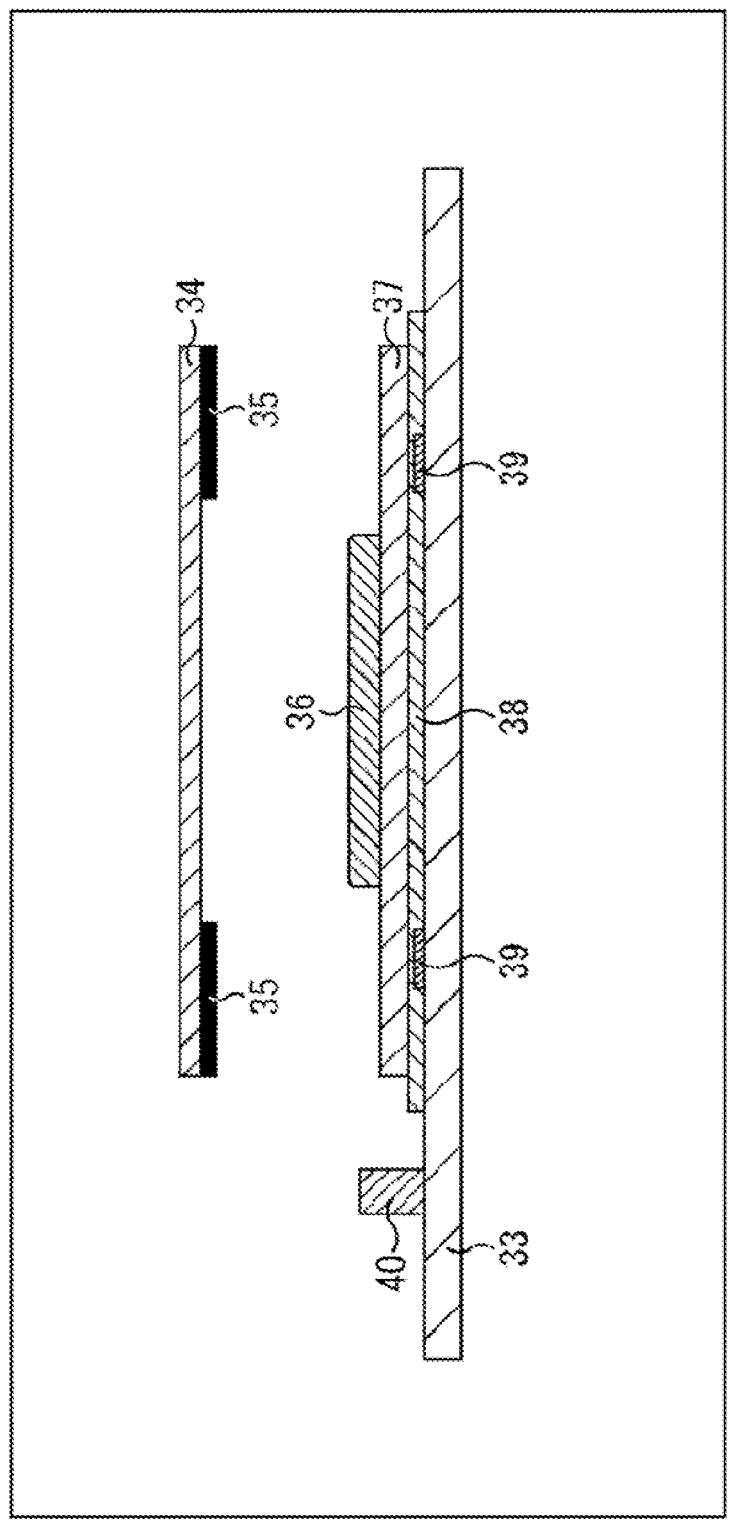
FIG. 7 is a diagram for explaining the method of manufacturing the camera module shown in FIG. 1.

In a fifth step, as shown in FIG. 7, the transparent resin 36 is applied onto the imaging surface of the imaging device 37.

Figure 8:
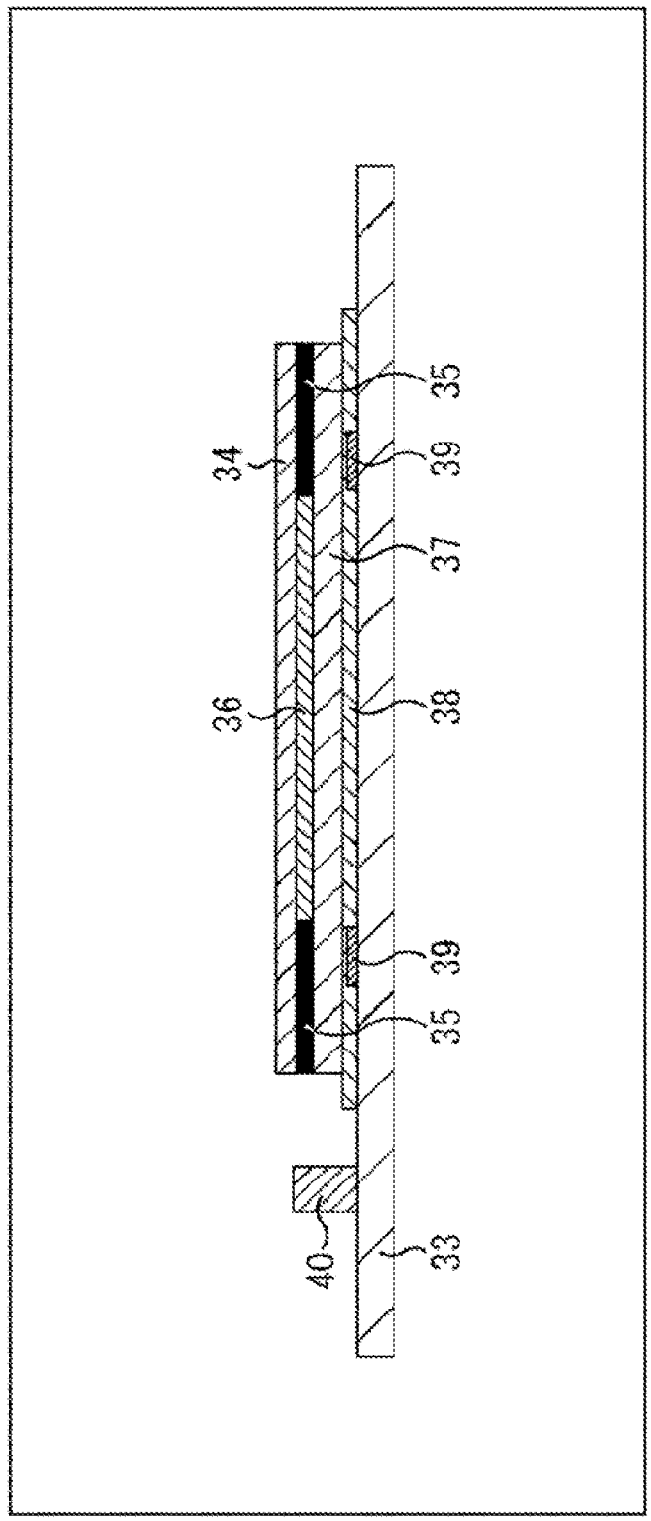
FIG. 8 is a diagram for explaining the method of manufacturing the camera module shown in FIG. 1.

In a sixth step, as shown in FIG. 8, the IRCF 34 having the light blocking film 35 printed or jet-dispensed thereon is attached while the surface having the light blocking film 35 printed thereon and the imaging surface of the imaging device 37 face each other. At this stage, the transparent resin 36 fills the inner side of the light blocking film 35 printed on the IRCF 34.

In a seventh step, as shown in FIG. 1, the case 32 is connected onto the substrate 33 so as to surround the imaging device 37, and the lens block 31 is further mounted on the case 32.

Through the above processing, the camera module 11 as shown in FIG. 1 is manufactured.

As described above, the imaging device 37 in an individualized state is provisionally fixed to the provisional substrate 51 with the provisional bonding member 52, and is then joined to the substrate 33 via the electrodes 39. After that, the provisional substrate 51 is detached with a solvent. This prevents the imaging device 37 from being joined to the substrate 33 in a deflected state or in a distorted state. Thus, it is possible to achieve a structure that does not require any sealing glass.

Specifically, as shown in FIG. 1, at the stage before the effective pixel region on the imaging surface of the imaging device 37, only the lens block 31 and the IRCF 34, which are indispensable for the camera module 11, are formed as the principal components, and there are no configurations such as a sealing glass. Thus, the height of the camera module 11 can be reduced.

Also, when the imaging device 37 is connected to the substrate 33, it is necessary to apply pressure from the imaging surface side of the imaging device 37. However, the imaging surface of the imaging device 37 is protected by the provisional substrate 51 to be detached later. Thus, a process and a member for protecting a sealing glass are not required as in a case where a sealing glass is provided, and the costs can be lowered.

Furthermore, the light blocking film 35 is formed by printing or jet dispensing on the IRCF 34. Accordingly, the height of the end faces of the light blocking film 35 becomes small, and the boundary between the light blocking portion and the glass surface can be made extremely small. Thus, reflected light reflected from the end faces of the light blocking film 35 is prevented from entering the imaging surface of the imaging device 37.

Also, the light blocking film 35 is formed on the IRCF 34, and its opening width is determined from the angle of the upper light ray of oblique light and the thickness of the transparent resin 36 bonding the ends of the effective pixel region of the imaging device 37 to the IRCF 34. Thus, a structure can be designed to eliminate reflection from the boundary between the end portions of the light blocking film 35 and the end portions of the transparent resin 36.

As a result, appearances of ghosts and flare can be reduced.

Furthermore, solder balls are not used, and joining is performed with electrodes that are formed with an RDL surface and have a TSV structure. Thus, it is possible to reduce warpage within the range of the focal length of the lens 31a in the lens block 31, and reduce height variation of the imaging surface of the imaging device 37 within waviness. As a result, appearances of distortions in captured images can be reduced.

Note that, as shown in FIG. 4, in a case where at least one of the electrodes 39a or 39b is precoated with solder, the UF 38 is applied onto the substrate 33 before the substrate 33 and the imaging device 37 are connected to remove the oxide film of the solder in the above described example. However, in a case where both the electrodes 39a and 39b are formed with Au, when the UF 38 is applied before the electrodes 39a and 39b are joined, there is a possibility that the surfaces of the electrodes 39a and 39b become too dirty to be connected to each other. Therefore, in a case where the electrodes 39a and 39b are formed with Au, after the electrodes 39a and 39b are joined by ultrasonic bonding without application of the UF 38, the UF 38 is dripped into the space between the imaging device 37 and the substrate 33, and a capillary effect (a capillary phenomenon) is taken advantage of, so that the space between the imaging device 37 and the substrate 33, except for the electrodes 39, is filled with the UF 38.

Example Applications to Electronic Apparatuses

For example, the above described camera module 11 can be used in various kinds of electronic apparatuses, such as imaging apparatuses like digital still cameras and digital video cameras, portable telephone devices having imaging functions, and other apparatuses having imaging functions.

Figure 9:
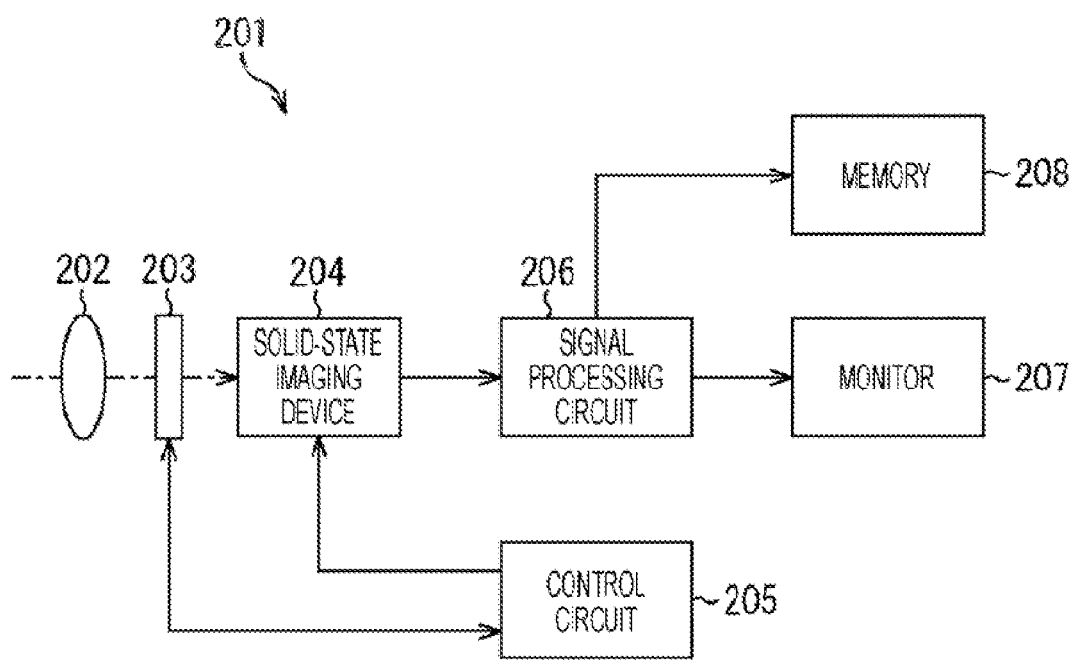
FIG. 9 is a block diagram showing an example configuration of an imaging apparatus as an electronic apparatus to which a camera module of the present disclosure is applied.

FIG. 9 is a block diagram showing an example configuration of an imaging apparatus as an electronic apparatus to which the present technology is applied.

The imaging apparatus 201 shown in FIG. 9 includes an optical system 202, a shutter device 203, a solid-state imaging device 204, a drive circuit 205, a signal processing circuit 206, a monitor 207, and a memory 208, and can take still images and moving images.

The optical system 202 includes one or more lenses to guide light (incident light) from an object to the solid-state imaging device 204, and form an image on the light receiving surface of the solid-state imaging device 204.

The shutter device 203 is placed between the optical system 202 and the solid-state imaging device 204, and, under the control of the drive circuit 1005, controls the light emission period and the light blocking period for the solid-state imaging device 204.

The solid-state imaging device 204 is formed with a package including the above described solid-state imaging device. In accordance with light that is emitted to form an image on the light receiving surface via the optical system 202 and the shutter device 203, the solid-state imaging device 204 accumulates signal charges for a certain period of time. The signal charges accumulated in the solid-state imaging device 204 are transferred in accordance with a drive signal (timing signal) supplied from the drive circuit 205.

The drive circuit 205 outputs the drive signal that controls the transfer operation of the solid-state imaging device 204 and the shutter operation of the shutter device 203, to drive the solid-state imaging device 204 and the shutter device 203.

The signal processing circuit 206 performs various kinds of signal processing on the signal charges output from the solid-state imaging device 204. The image (image data) obtained through the signal processing performed by the signal processing circuit 206 is supplied to and displayed on the monitor 207, or is supplied to and stored (recorded) into the memory 208.

In the imaging apparatus 201 configured as described above, it is also possible to further reduce the height of the apparatus while reducing ghosts and flare, by using the camera module 11 in place of the optical system 202, the shutter device 203, and the solid-state imaging device 204, which have been described above.

Examples of Use of a Solid-State Imaging Device

Figure 10:
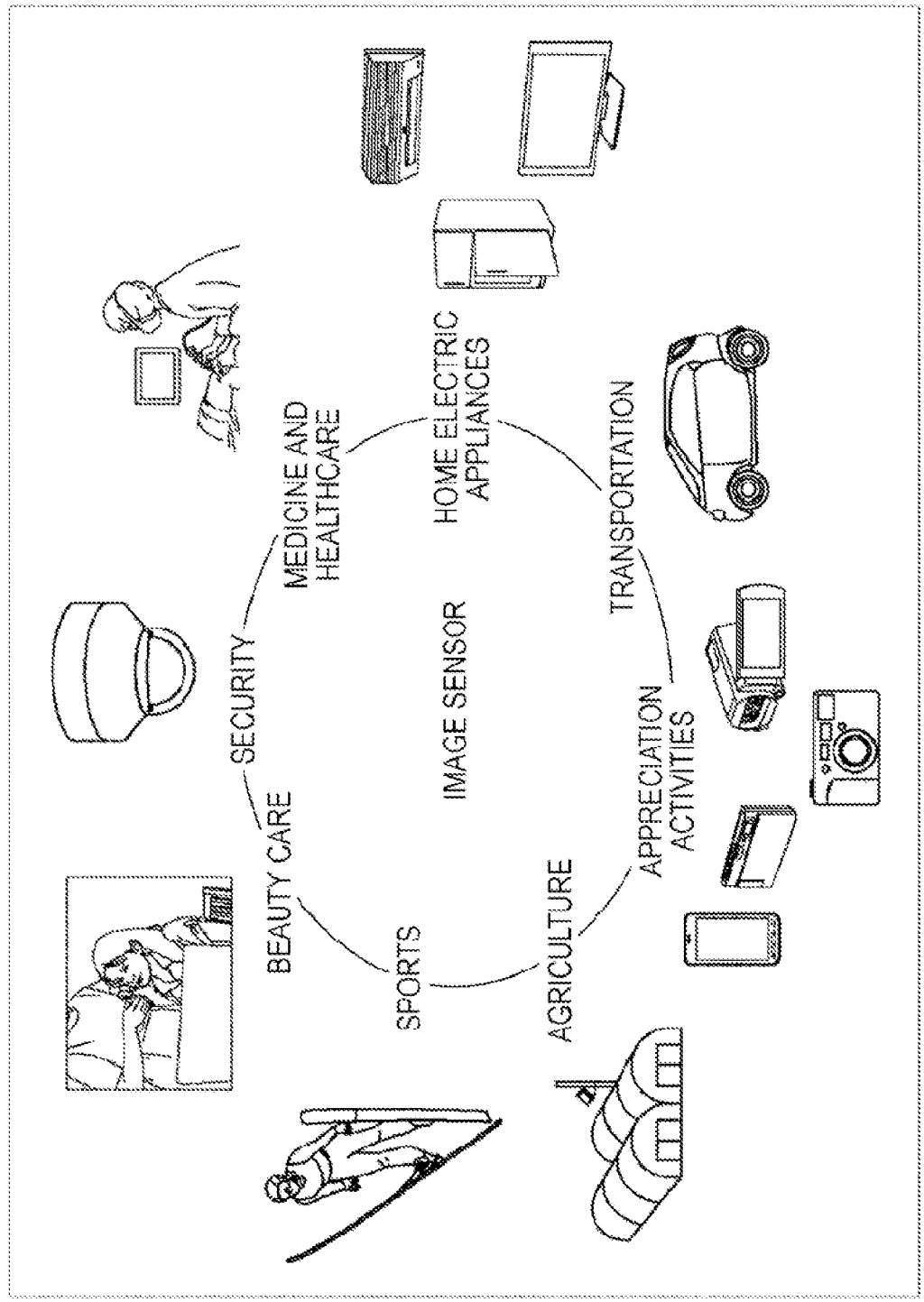
FIG. 10 is a diagram for explaining examples of use of a camera module to which the technology of the present disclosure is applied.

FIG. 10 is a diagram showing examples of use of the camera module 11 described above.

The above described camera module can be used in various cases where light such as visible light, infrared light, ultraviolet light, or an X-ray is sensed as described below, for example.

- Devices configured to take images for appreciation activities, such as digital cameras and portable devices with camera functions.
- Devices for transportation use, such as vehicle-mounted sensors configured to take images of the front, the back, the surroundings, the inside, and the like of an automobile to perform safe driving such as an automatic stop and recognize the driver's condition and the like, surveillance cameras for monitoring running vehicles and roads, and ranging sensors for measuring distances between vehicles or the like.
- Devices to be used in conjunction with home electric appliances, such as television sets, refrigerators, and air conditioners, to take images of gestures of users and operate the appliances in accordance with the gestures.
- Devices for medical care use and health care use, such as endoscopes and devices for receiving infrared light for angiography.
- Devices for security use, such as surveillance cameras for crime prevention and cameras for personal authentication.
- Devices for beauty care use, such as skin measurement devices configured to image the skin and microscopes for imaging the scalp.

Devices for sporting use, such as action cameras and wearable cameras for sports and the like.

Devices for agricultural use such as cameras for monitoring conditions of fields and crops.

Example Applications to In-Vivo Information Acquisition System

The present technology according to the present disclosure can be applied to various products. For example, the present technology according to the present disclosure may be applied to an endoscopic surgery system.

Figure 11:
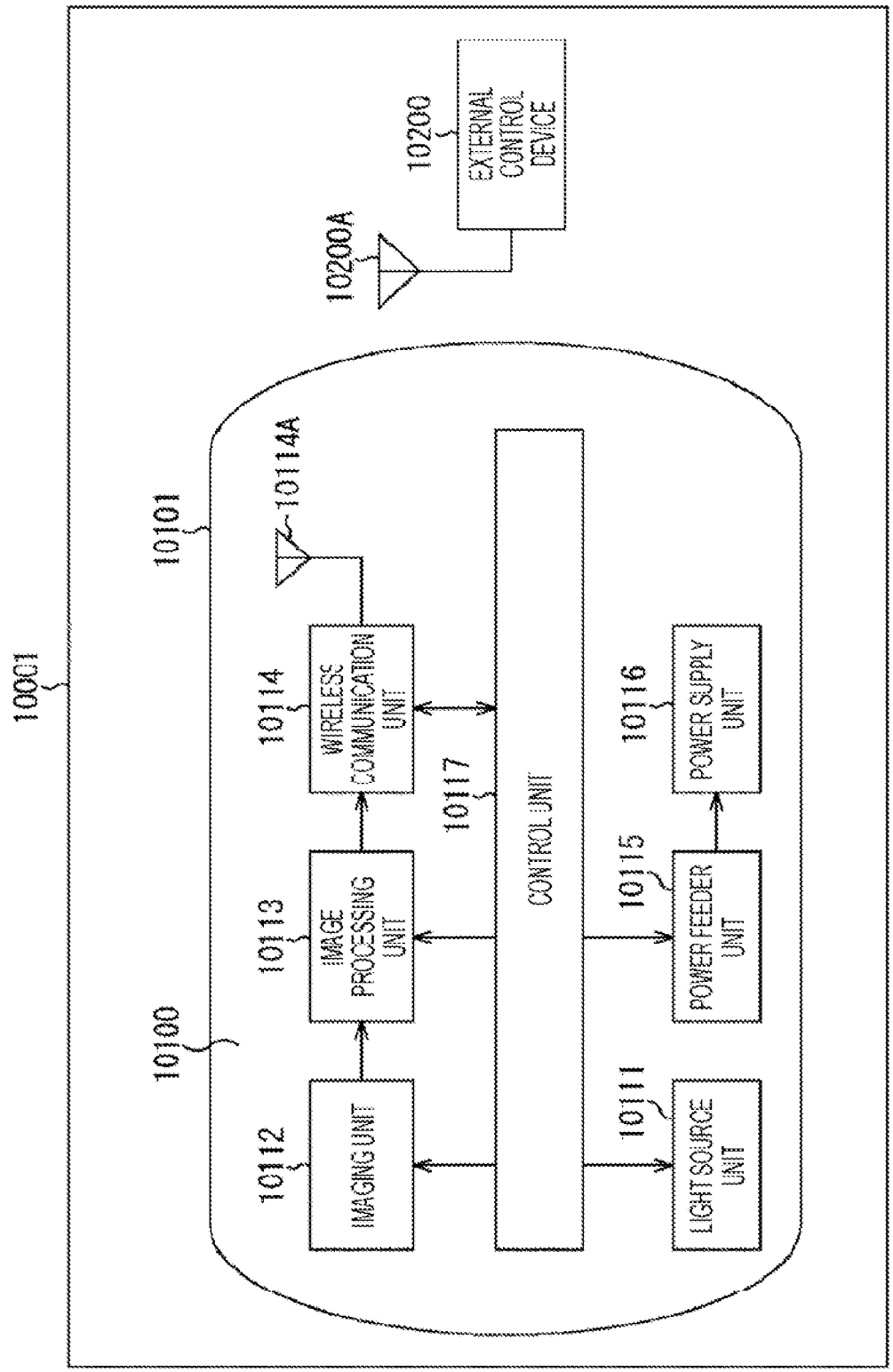
FIG. 11 is a block diagram schematically showing an example configuration of an in-vivo information acquisition system.

FIG. 11 is a block diagram schematically showing an example configuration of a system for acquiring in-vivo information about a patient with a capsule endoscope to which a present technology according to the present disclosure can be applied.

An in-vivo information acquisition system 10001 includes a capsule endoscope 10100 and an external control device 10200.

The capsule endoscope 10100 is swallowed by the patient at the time of examination. The capsule endoscope 10100 has an imaging function and a wireless communication function. Before naturally discharged from the patient, the capsule endoscope 10100 moves inside the internal organs such as the stomach and the intestines by peristaltic motion or the like, sequentially captures images of the inside of the internal organs (these images will be hereinafter also referred to as in-vivo images) at predetermined intervals, and sequentially transmits information about the in-vivo images to the external control device 10200 outside the body in a wireless manner.

The external control device 10200 controls the overall operation of the in-vivo information acquisition system 10001. The external control device 10200 also receives the information about the in-vivo images transmitted from the capsule endoscope 10100, and, in accordance with the received in-vivo image information, generates image data for displaying the in-vivo images on a display device (not shown).

In this manner, the in-vivo information acquisition system 10001 can acquire in-vivo images showing the states of the inside of the body of the patient at any appropriate time until the swallowed capsule endoscope 10100 is discharged.

The configurations and the functions of the capsule endoscope 10100 and the external control device 10200 are now described in greater detail.

The capsule endoscope 10100 has a capsule-like housing 10101, and the housing 10101 houses a light source unit 10111, an imaging unit 10112, an image processing unit 10113, a wireless communication unit 10114, a power feeder unit 10115, a power supply unit 10116, and a control unit 10117.

The light source unit 10111 is formed with a light source such as a light emitting diode (LED), for example, and emits light onto the imaging field of view of the imaging unit 10112.

The imaging unit 10112 is formed with an imaging device and an optical system including a plurality of lenses provided in front of the imaging device. Reflected light of light emitted to body tissue as the current observation target (this reflected light will be hereinafter referred to as the observation light) is collected by the optical system, and enters the imaging device. In the imaging unit 10112, the observation light incident on the imaging device is photoelectrically converted, and an image signal corresponding to the observation light is generated. The image signal generated by the imaging unit 10112 is supplied to the image processing unit 10113.

The image processing unit 10113 is formed with a processor such as a central processing unit (CPU) or a graphics processing unit (GPU), and performs various kinds of signal processing on the image signal generated by the imaging unit 10112. The image processing unit 10113 supplies the image signal subjected to the signal processing as RAW data to the wireless communication unit 10114.

The wireless communication unit 10114 performs predetermined processing such as modulation processing on the image signal subjected to the signal processing by the image processing unit 10113, and transmits the image signal to the external control device 10200 via an antenna 10114A. The wireless communication unit 10114 also receives a control signal related to control of driving of the capsule endoscope 10100 from the external control device 10200 via the antenna 10114A. The wireless communication unit 10114 supplies the control signal received from the external control device 10200 to the control unit 10117.

The power feeder unit 10115 includes an antenna coil for power reception, a power regeneration circuit that regenerates electric power from the current generated in the antenna coil, a booster circuit, and the like. In the power feeder unit 10115, electric power is generated according to a so-called non-contact charging principle.

The power supply unit 10116 is formed with a secondary battery, and stores the electric power generated by the power feeder unit 10115. In FIG. 11, to avoid complication of the drawing, an arrow or the like indicating the destination of power supply from the power supply unit 10116 is not shown. However, the electric power stored in the power supply unit 10116 is supplied to the light source unit 10111, the imaging unit 10112, the image processing unit 10113, the wireless communication unit 10114, and the control unit 10117, and can be used for driving these units.

The control unit 10117 is formed with a processor such as a CPU, and drives the light source unit 10111, the imaging unit 10112, the image processing unit 10113, the wireless communication unit 10114, and the power feeder unit 10115 unit as appropriate in accordance with a control signal transmitted from the external control device 10200.

The external control device 10200 is formed with a processor such as a CPU or a GPU, or a microcomputer, a control board, or the like on which a processor and a storage element such as a memory are mounted together. The external control device 10200 controls operation of the capsule endoscope 10100 by transmitting a control signal to the control unit 10117 of the capsule endoscope 10100 via an antenna 10200A. In the capsule endoscope 10100, the conditions for emitting light to the current observation target in the light source unit 10111 can be changed in accordance with the control signal from the external control device 10200, for example. The imaging conditions (such as the frame rate, the exposure value, and the like in the imaging unit 10112, for example) can also be changed in accordance with the control signal from the external control device 10200. Further, the contents of the processing in the image processing unit 10113 and the conditions (such as the transmission intervals and the number of images to be transmitted, for example) for the wireless communication unit 10114 to transmit image signals may be changed in accordance with the control signal from the external control device 10200.

The external control device 10200 also performs various kinds of image processing on the image signal transmitted from the capsule endoscope 10100, and generates image data for displaying a captured in-vivo image on the display device. Examples of the image processing include various kinds of signal processing, such as a development process (a demosaicing process), an image quality enhancement process (a band emphasizing process, a super-resolution process, a noise reduction (NR) process, a camera shake correction process, and/or the like), and/or an enlargement process (an electronic zooming process). The external control device 10200 controls driving of the display device, to cause the display device to display an in-vivo image captured in accordance with the generated image data. Alternatively, the external control device 10200 may cause a recording device (not shown) to record the generated image data, or cause a printing device (not shown) to print out the generated image data.

An example of an in-vivo information acquisition system to which the technology according to the present disclosure can be applied has been described above. The technology according to the present disclosure can be applied to the imaging unit 10112 in the above described configuration. Specifically, the camera module 11 shown FIG. 1 can be applied to the imaging unit 10112. By applying the technology according to the present disclosure to the imaging unit 10112, it is possible to further reduce the height of the apparatus while reducing ghosts and flare.

Example Application to an Endoscopic Surgery System

The present technology according to the present disclosure can be applied to various products. For example, the present technology according to the present disclosure may be applied to an endoscopic surgery system.

Figure 12:
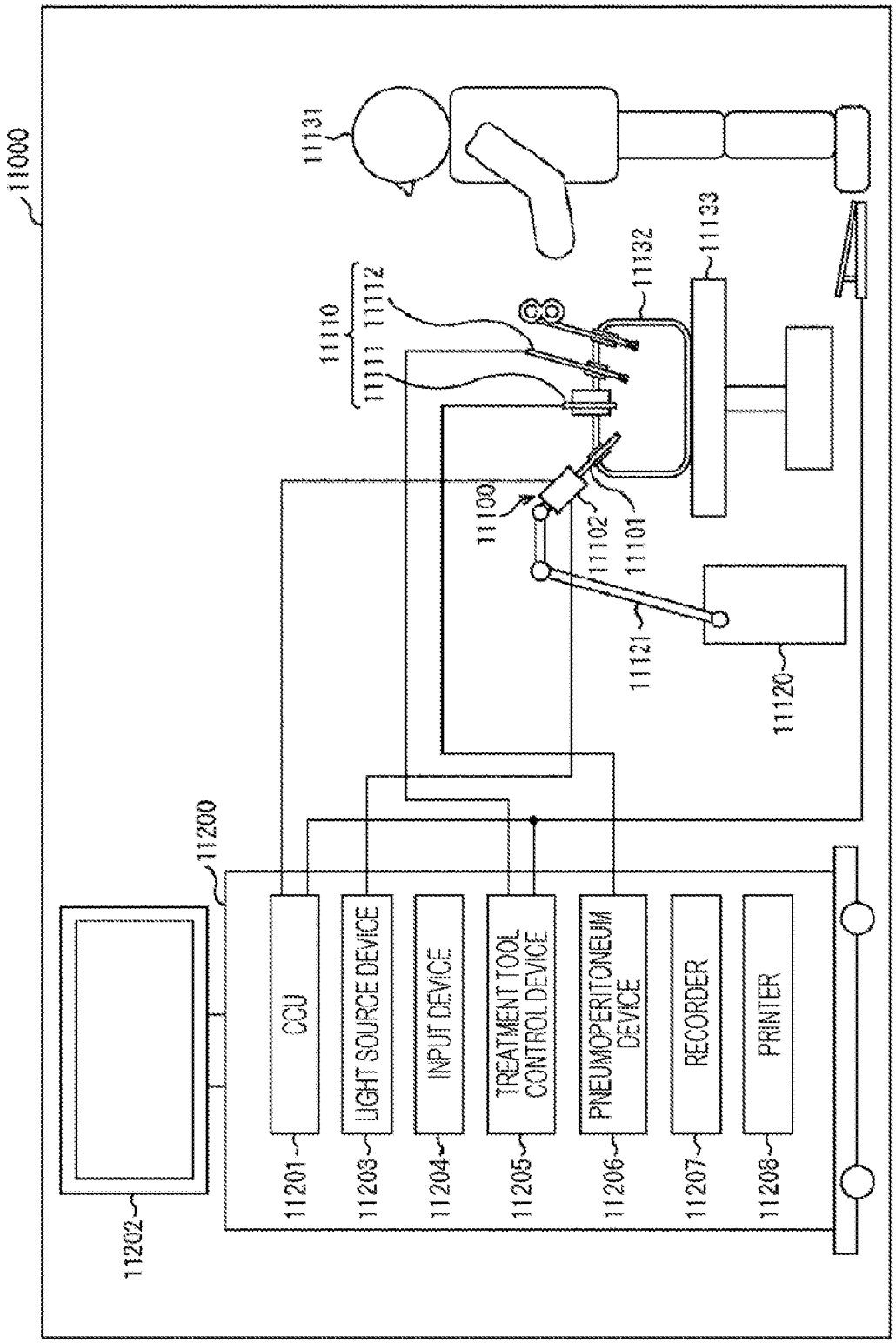
FIG. 12 is a diagram schematically showing an example configuration of an endoscopic surgery system.

FIG. 12 is a diagram schematically showing an example configuration of an endoscopic surgery system to which the present technology according to the present disclosure can be applied.

FIG. 12 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is configured as a so-called rigid scope having a rigid lens barrel 11101. However, the endoscope 11100 may be configured as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a direct-view mirror, an oblique-view mirror, or a side-view mirror.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, or an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. The CCU 11201 further receives an image signal from the camera head 11102, and performs, on the image signal, various kinds of image processing for displaying the image based on the image signal, such as a development process (a demosaicing process), for example.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging a surgical portion or the like.

An input device 11204 is an input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical portion can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

The driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

The light source device 11203 may also be designed to be capable of supplying light of a predetermined wavelength band corresponding to special light observation. In special light observation, light of a narrower band than the illuminating light (or white light) at the time of normal observation is emitted, with the wavelength dependence of light absorption in body tissue being taken advantage of, for example. As a result, so-called narrow band imaging is performed to image predetermined tissue such as a blood vessel in a mucosal surface layer or the like, with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of suppling narrowband light and/or excitation light compatible with such special light observation.

Figure 13:
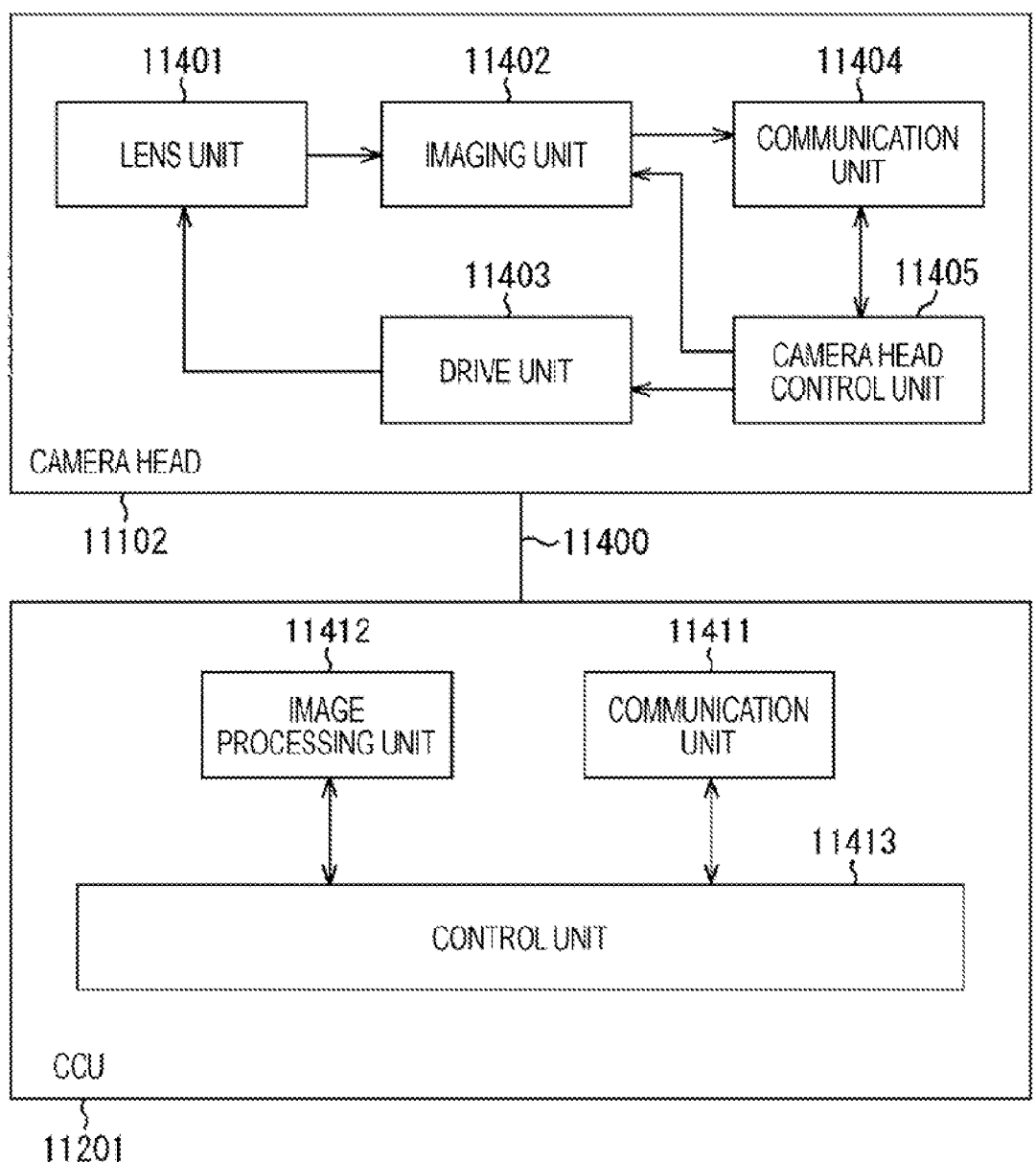
FIG. 13 is a block diagram showing an example of the functional configurations of a camera head and a CCU.

FIG. 13 is a block diagram showing an example of the functional configurations of the camera head 11102 and the CCU 11201 shown in FIG. 12.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-plate type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the living tissue at the surgical portion. Note that, in a case where the imaging unit 11402 is of a multiple-plate type, a plurality of lens units 11401 can be provided in accordance with the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be appropriately adjusted.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

The communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 in accordance with an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, in accordance with a control signal received from the CCU 11201 via the communication unit The communication unit 11411 is formed with a communication device for transmitting and receiving various kinds of information to and from the camera head 11102. The communication unit 11411 receives an image signal transmitted from the camera head 11102 via the transmission cable 11400.

The communication unit 11411 also transmits a control signal for controlling the driving of the camera head 11102 to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical portion or the like captured by the endoscope 11100, and a captured image obtained through imaging of the surgical portion or the like. For example, the control unit 11413 generates a control signal for controlling the driving of the camera head 11102.

The control unit 11413 also causes the display device 11202 to display a captured image of the surgical portion or the like, in accordance with the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body part, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical portion on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400, but communication between the camera head 11102 and the CCU 11201 may be performed in a wireless manner.

An example of an endoscopic surgery system to which the technology according to the present disclosure can be applied has been described above. The technology according to the present disclosure can be applied to the imaging unit 11402 of the camera head 11102 in the above described configuration. Specifically, the camera module 11 shown FIG. 1 can be applied to the imaging unit 10402. By applying the technology according to the present disclosure to the imaging unit 10402, it is possible to further reduce the height of the apparatus while reducing ghosts and flare.

Note that, although an endoscopic surgical system has been described as an example, the technology according to present disclosure may be applied to other systems such as a microscopic surgery system and the like, for example.

Example Applications to Mobile Structures

The present technology according to the present disclosure can be applied to various products. For example, the technology according to the present disclosure may be embodied as devices to be mounted on any type of mobile structures such as automobiles, electric vehicles, hybrid electric vehicles, motorcycles, bicycles, personal mobility, airplanes, drones, ships, and robots.

Figure 14:
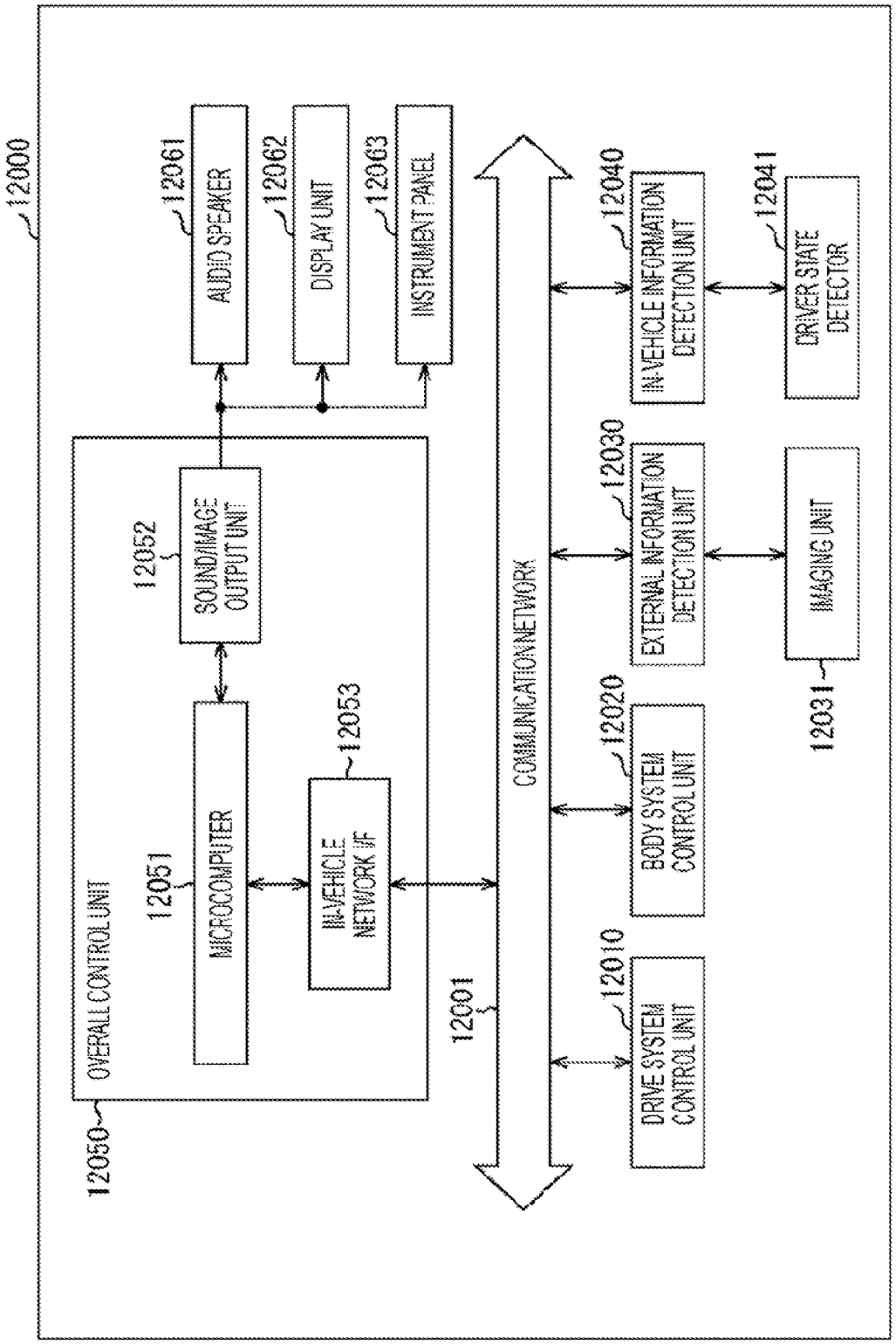
FIG. 14 is a block diagram schematically showing an example configuration of a vehicle control system.

FIG. 14 is a block diagram schematically showing an example configuration of a vehicle control system that is an example of a mobile structure control system to which the technology according to the present disclosure can be applied.

A vehicle control system 12000 includes a plurality of electronic control units connected via a communication network 12001. In the example shown in FIG. 14, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are shown as a functional configuration of the overall control unit 12050.

The drive system control unit 12010 controls operations of the devices relating to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a head lamp, a backup lamp, a brake lamp, a turn signal lamp, a fog lamp, or the like. In this case, the body system control unit 12020 can receive a radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. In accordance with the received image, the external information detection unit 12030 may perform an object detection process for detecting a person, a vehicle, an obstacle, a sign, characters on the road surface, or the like, or a distance detection process.

The imaging unit 12031 is an optical sensor that receives light and outputs an electrical signal corresponding to the amount of the received light. The imaging unit 12031 can output the electrical signal as an image, or output the electrical signal as distance measurement information. Further, the light to be received by the imaging unit 12031 may be visible light, or may be invisible light such as infrared light.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, in accordance with detected information input from the driver state detector 12041, the in-vehicle information detection unit 12040 may calculate the degree of fatigue or the degree of concentration of the driver, or determine whether or not the driver is dozing off.

In accordance with the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle speed maintenance running, vehicle collision warning, vehicle lane deviation warning, or the like.

The microcomputer 12051 can also perform cooperative control to conduct automatic driving or the like for autonomously running not depending on the operation of the driver, by controlling the driving force generation device, the steering mechanism, the braking device, or the like in accordance with information about the surroundings of the vehicle, the information having being acquired by the external information detection unit 12030 or the in-vehicle information detection unit 12040.

The microcomputer 12051 can also output a control command to the body system control unit 12020, in accordance with the external information acquired by the external information detection unit 12030. For example, the microcomputer 12051 controls the headlight in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 16, an audio speaker 12061, a display unit 12062, and an instrument panel 12063 are shown as output devices. The display unit 12062 may include an on-board display and/or a head-up display, for example.

Figure 15:
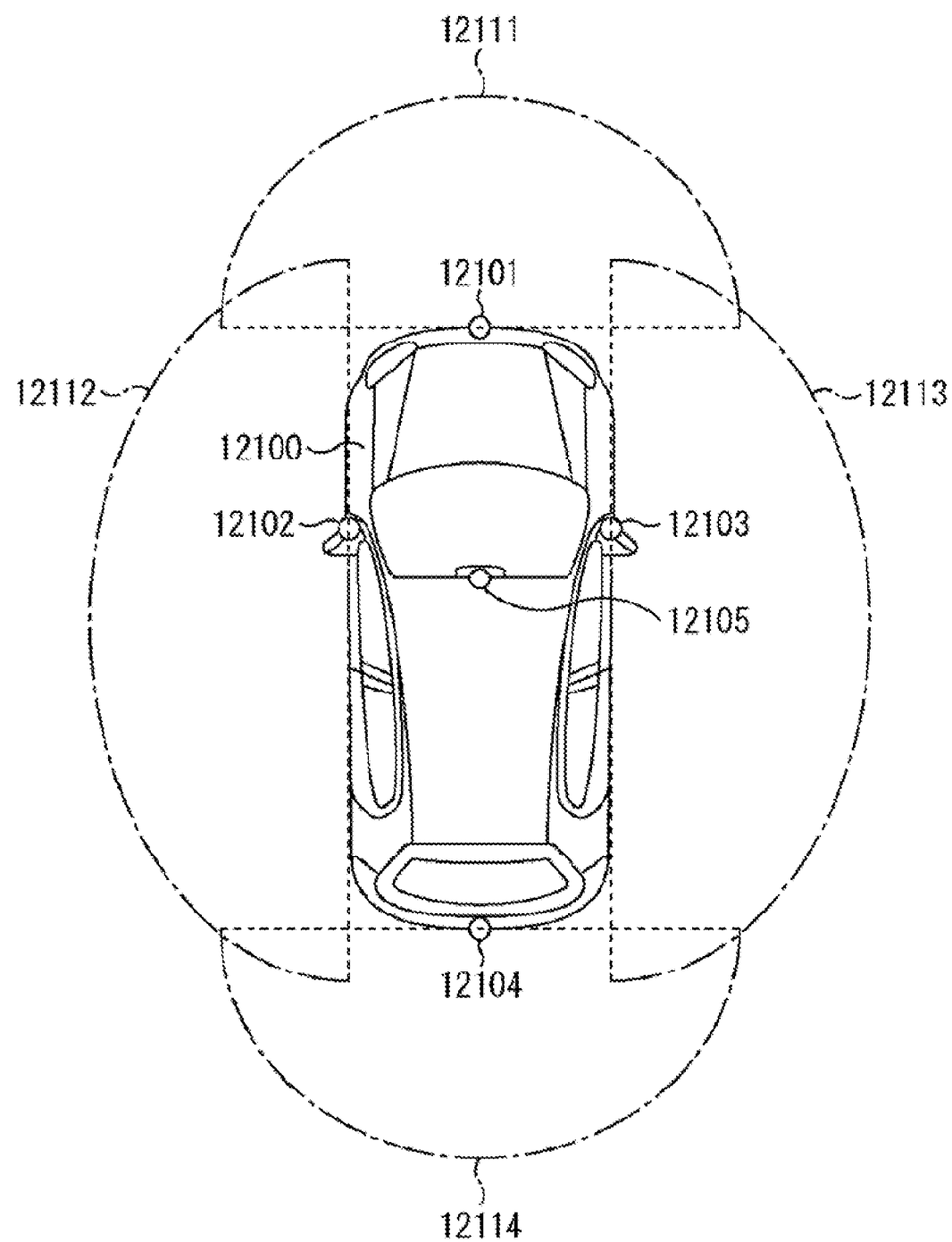
FIG. 15 is an explanatory diagram showing an example of installation positions of an external information detector and imaging units.

FIG. 15 is a diagram showing an example of the installation position of the imaging unit 12031.

In FIG. 15, a vehicle 12100 includes imaging units 12101, 12102, 12103, 12104, and 12105 as the imaging unit 12031.

The imaging units 12101, 12102, 12103, 12104, and 12105 are provided at positions such as the front end edge of the vehicle 12100, the side mirrors, the rear bumper, the rear doors, and an upper portion of the front windshield inside the vehicle, for example. The imaging unit 12101 provided on the front end edge and the imaging unit 12105 provided at the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 15 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, in accordance with distance information obtained from the imaging units 12101 through 12104, the microcomputer 12051 calculates the distances to the respective three-dimensional objects within the imaging ranges 12111 through 12114, and temporal changes in the distances (the speeds relative to the vehicle 12100). In this manner, the three-dimensional object that is the closest three-dimensional object on the traveling path of the vehicle 12100 and is traveling at a predetermined speed (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, in accordance with the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 outputs a warning to the driver via the audio speaker 12061 and the display unit 12062, or can perform driving assistance for avoiding collision by performing forced deceleration or avoiding steering via the drive system control unit 12010.

At least one of the imaging units 12101 through 12104 may be an infrared camera that detects infrared light. For example, the microcomputer 12051 can recognize a pedestrian by determining whether or not a pedestrian exists in images captured by the imaging units 12101 through 12104. Such pedestrian recognition is carried out through, for example, a process of extracting feature points from the images captured by the imaging units 12101 through 12104 serving as infrared cameras, and a process of performing a pattern matching on the series of feature points indicating the outlines of objects and determining whether or not there is a pedestrian. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. The sound/image output unit 12052 may also control the display unit 12062 to display an icon or the like indicating the pedestrian at a desired position.

An example of a vehicle control system to which the technology according to the present disclosure can be applied has been described above. The technology according to the present disclosure can be applied to the imaging unit 12031 in the above described configuration. Specifically, the camera module 11 shown FIG. 1 can be applied to the imaging unit 12031. By applying the technology according to the present disclosure to the imaging unit 12031, it is possible to further reduce the height of the apparatus while reducing ghosts and flare.

Note that the present disclosure can also be embodied as follows.

(1) A camera module including:

an imaging device that captures an image;

an infrared light removal unit that removes infrared light toward the imaging device in a stage before the imaging device; and a light collection unit that collects light incident on the imaging device, in which, in a stage before the imaging device in an imaging direction, only the light collection unit and the infrared light removal unit are provided.

(2) The camera module according to (1), in which the infrared light removal unit is an IR cut filter (IRCF), and a light blocking film is formed in a region of the IRCF, the region corresponding to a region other than an effective pixel region of the imaging device.

(3) The camera module according to (2), in which the light blocking film is printed or jet-dispensed on the IRCF.

(4) The camera module according to (3), in which a space surrounded by the light blocking film, the IRCF, and an imaging surface of the imaging device is filled with a transparent resin.

(5) The camera module according to any of (1) to (4), in which the imaging device and a substrate are connected by a mutually provided electrode having a through-silicon-via (TSV) structure.

(6) The camera module according to (5), in which, between the imaging device and the substrate, a space other than the connected electrode having the TSV structure is filled with an underfill resin.

(7) An imaging apparatus including:
an imaging device that captures an image;
an infrared light removal unit that removes infrared light toward the imaging device in a stage before the imaging device; and
a light collection unit that collects light incident on the imaging device,
in which, in the stage before the imaging device, only the light collection unit and the infrared light removal unit are provided.

(8) An electronic apparatus including:
an imaging device that captures an image;
an infrared light removal unit that removes infrared light toward the imaging device in a stage before the imaging device; and
a light collection unit that collects light incident on the imaging device,
in which, in the stage before the imaging device, only the light collection unit and the infrared light removal unit are provided.

(9) A method of manufacturing a camera module including:
an imaging device that captures an image;
an infrared light removal unit that removes infrared light toward the imaging device in a stage before the imaging device; and
a light collection unit that collects light incident on the imaging device,
only the light collection unit and the infrared light removal unit being provided in the stage before the imaging device,
the method including:
bonding a provisional substrate to an imaging surface of the imaging device;
joining a surface of the imaging device bonded to the provisional substrate to a substrate, the provisional substrate not being bonded to the surface of the imaging device; and
detaching the provisional substrate from the imaging surface of the imaging device.

(10) The method of manufacturing a camera module according to (9), further including:
bonding the infrared light removal unit that removes infrared light toward the imaging device to the imaging surface of the imaging device, after detaching the provisional substrate from the imaging surface of the imaging device; and
mounting the light collection unit in a stage before the infrared light removal unit.

(11) The method of manufacturing a camera module according to (10), in which the infrared light removal unit is an IR cut filter (IRCF), and a light blocking film is formed in a region of the IRCF, the region corresponding to a region other than an effective pixel region of the imaging device.

(12) The method of manufacturing a camera module according to (11), in which the light blocking film is printed or jet-dispensed on the IRCF.

(13) The method of manufacturing a camera module according to (12), further including: applying a transparent resin between the imaging device and the IRCF, when bonding the IRCF to the imaging surface of the imaging device after detaching the provisional substrate from the imaging surface of the imaging device; and
filling a space with the transparent resin, the space being surrounded by the light blocking film, the printed or jet-dispensed IRCF, and the imaging surface of the imaging device.

REFERENCE SIGNS LIST

11 Camera module
31 Lens block
32 Case
33 Substrate
34 IRCF
35 Light blocking film
36 Transparent resin
37 Imaging device
38 Underfill (UF)
39, 39a, 39b Electrode
40 Passive component

The invention claimed is:
1. A camera module, comprising:
a substrate;
an imaging device including:
an effective pixel region;
a first surface; and
a second surface opposite to the first surface,
wherein the imaging device is disposed on the substrate;
a light blocking film disposed outside of the effective pixel region of the imaging device;
a case that is disposed on the substrate and surrounds the imaging device;
a lens block that is mounted on the case and includes a lens collecting light incident on the imaging device;
an infrared (IR) cut filter disposed above the first surface of the imaging device,
wherein the IR cut filter has a same width as the imaging device, and
wherein the IR cut filter has a width greater than a width of the lens; and
a transparent resin disposed between the light blocking film,
wherein the light blocking film and the transparent resin are each disposed on and in contact with the first surface of the imaging device,
wherein the light blocking film is attached with the transparent resin,
wherein the transparent resin is disposed within the effective pixel region in a space surrounded by the light blocking film in a nonoverlapping manner with the light block film, and
wherein outer edges of the light blocking film are consistent with outer edges of the imaging device in a planar view.

2. The camera module according to claim 1, further comprising an electrode disposed on the second surface of the imaging device, wherein the electrode of the imaging device is connected to a mutually provided electrode of the substrate a through-silicon-via (TSV) structure.

3. The camera module according to according to claim 2, wherein, between the imaging device and the substrate, a space other than the electrode and the mutually provided electrode having the TSV structure is filled with an underfill resin.

4. The camera module according to claim 2, wherein the mutually provided electrode is formed with Au.

5. The camera module according to claim 2, wherein the light blocking film is disposed over the mutually provided electrode in a vertical direction.

6. The camera module according to claim 1, wherein the light blocking film is printed or jet-dispensed on the IR cut filter.

7. The camera module according to claim 1, wherein the light blocking film is formed with a black carbon-based resin.

8. A package, comprising:
   an imaging device including:
     an effective pixel region;
     a first surface; and
     a second surface opposite to the first surface;
   a light blocking film disposed outside of the effective pixel region of the imaging device;
   an infrared (IR) cut filter disposed above the imaging device,
   wherein the IR cut filter has a same width as the imaging device;
   a lens block provided above the IR cut filter and includes a lens collecting light incident on the imaging device,
   wherein the IR cut filter has a width greater than a width of the lens; and
   a transparent resin disposed between the light blocking film,
   wherein the light blocking film and the transparent resin are each disposed on and in contact with the first surface of the imaging device,
   wherein the light blocking film is attached with the transparent resin,
   wherein the transparent resin is disposed within the effective pixel region in a space surrounded by the light blocking film in a nonoverlapping manner with the light block film, and
   wherein outer edges of the light blocking film are consistent with outer edges of the imaging device in a planar view.

9. The package according to claim 8, wherein the imaging device and a substrate are connected by an electrode provided on the second surface of the imaging device and a mutually provided electrode on the substrate having a through-silicon-via (TSV) structure.

10. The package according to claim 9, wherein, between the imaging device and the substrate, a space other than the electrode and the mutually provided electrode having the TSV structure is filled with an underfill resin.

11. The package according to claim 9, wherein the mutually provided electrode is formed with Au.

12. The package according to claim 9, wherein the light blocking film is disposed over the mutually provided electrode in a vertical direction.

13. The package according to claim 8, wherein the light blocking film is printed or jet-dispensed on the IR cut filter.

14. The package according to claim 8, wherein the light blocking film is formed with a black carbon-based resin.

15. A method of manufacturing a camera module, comprising:
   disposing an imaging device on a substrate,
   wherein the imaging device includes an effective pixel region, a first surface and a second surface opposite to the first surface;
   disposing a light blocking film outside of the effective pixel region of the imaging device;
   disposing an infrared (IR) cut filter above the first surface of the imaging device,
   wherein the IR cut filter has a same width as the imaging device;
   disposing a case on the substrate and surrounding the imaging device;
   mounting a lens block on the case, wherein the lens block includes a lens collecting light incident on the imaging device,
   wherein the IR cut filter has a width greater than a width of the lens; and
   disposing a transparent resin between the light blocking film,
   wherein the light blocking film and the transparent resin are each disposed on and in contact with the first surface of the imaging device,
   wherein the light blocking film is attached with the transparent resin,
   wherein the transparent resin is disposed within the effective pixel region in a space surrounded by the light blocking film in a nonoverlapping manner with the light blocking film, and
   wherein outer edges of the light blocking film are consistent with outer edges of the imaging device in a planar view.

16. The method of manufacturing a camera module according to claim 15, further comprising:
   printing or jet-dispensing the light blocking film on the IR cut filter.

17. The method of manufacturing a camera module according to claim 15, further comprising:
   disposing an electrode on the second surface of the imaging device; and
   connecting the electrode of the imaging device and a mutually provided electrode of the substrate having a through-silicon-via (TSV) structure.

18. The method of manufacturing a camera module according to claim 17, further comprising filling with an underfill resin, between the imaging device and the substrate, a space other than the electrode and the mutually provided electrode having the TSV structure.

19. The method of manufacturing a camera module according to claim 17, further comprising forming the mutually provided electrode with Au.

20. The method of manufacturing a camera module according to claim 15, further comprising forming the light blocking film with a black carbon-based resin.

* * * * *